United States Patent
Yoshitake et al.

(10) Patent No.: US 6,914,923 B2
(45) Date of Patent: Jul. 5, 2005

(54) SEMICONDUCTOR LASER AND MANUFACTURING METHOD THEREOF

(75) Inventors: Shunji Yoshitake, Kawasaki (JP); Toshiyuki Terada, Kawasaki (JP); Akira Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 10/445,912

(22) Filed: May 28, 2003

(65) Prior Publication Data

US 2004/0022287 A1 Feb. 5, 2004

(30) Foreign Application Priority Data

Jun. 3, 2002 (JP) ........................................ 2002-161814

(51) Int. Cl.[7] .............................................. H01S 5/00
(52) U.S. Cl. ........................................ 372/45; 372/46
(58) Field of Search ...................... 372/43–50

(56) References Cited

U.S. PATENT DOCUMENTS 6,522,676 B1 * 2/2003 Goto et al. .................... 372/43

FOREIGN PATENT DOCUMENTS

JP     2000286504 A  * 10/2000  ............ H01S/5/22
JP     2001-274513      10/2001

* cited by examiner

Primary Examiner—Minsun Oh Harvey
Assistant Examiner—Phillip Nguyen
(74) Attorney, Agent, or Firm—Oblon, Spivak, McClelland, Maier & Neustadt, P.C.

(57) ABSTRACT

A semiconductor laser includes a substrate, a double hetero structure portion formed on the substrate, the double hetero structure including a first clad layer formed on the substrate, an active layer formed on the first clad layer and a second clad layer formed on the active layer, the second clad layer having a stripe-form projection on an upper surface thereof, the projection having an upper portion whose sidewalls are substantially vertically formed on the surface of the substrate and a step-shaped lower portion whose line width is larger than that of the upper portion, and a current blocking layer formed extending from side surfaces of the projection to the upper surface of the second clad layer except an upper surface of the projection.

18 Claims, 5 Drawing Sheets

|  | Step height (μm) | | |
|---|---|---|---|
|  |  | 0.4 | 0.7 | 1.0 |
| Step width (μm) | 0.4 | Excellent | Excellent | Good |
|  | 0.7 | Poor | Poor | Good |
|  | 1.0 | Poor | Poor | Poor |

SEMICONDUCTOR LASER AND MANUFACTURING METHOD THEREOF

CROSS-REFERENCE TO RELATED APPLICATIONS

This application is based upon and claims the benefit of priority from the prior Japanese Patent Application No. 2002-161814, filed Jun. 3, 2002, the entire contents of which are incorporated herein by reference.

BACKGROUND OF THE INVENTION

1. Field of the Invention

The present invention relates to a semiconductor laser having a ridge-shaped current concentration portion, and more particularly to a semiconductor laser obtained by improving a shape, and a manufacturing method thereof.

2. Description of the Related Art

In recent years, there has been developed a semiconductor laser having a ridge-shaped current concentration portion (ridge portion) in a double hetero structure as a light source having a short wavelength and a high output. In this type of laser, in order to obtain a target laser characteristic, strict control over a ridge width is important. In particular, in a semiconductor laser which is used as a high-output light source for a CD-R or a DVD-R, a reduction in a ridge width is required, as well as strict control of the ridge width.

However, in a generally used wet etching process, a ridge side surface after etching processing has a sequential taper shape. Therefore, when the ridge width is reduced, there occur problems of an increase in an operating voltage caused due to a reduction in an upper ridge width and occurrence of a kink in the optical output—current characteristic.

It is to be noted that both the width and the height of the ridge portion must be strictly controlled. In a prior art, an etching stop layer is inserted in the middle of a clad layer, and etching of the clad layer is stopped by the etching stop layer, thereby controlling the height of the ridge portion. This etching is possible by wet etching, but dry etching such as reactive ion etching (RIE) can hardly assuredly stop etching by using the etching stop layer. Therefore, wet etching must be used for etching in order to form the ridge, and the ridge shape cannot be prevented from having the sequential tapered shape in actual practice.

As described above, conventionally, in the semiconductor laser having the ridge portion, it is hard to form the side surface of the ridge portion to be vertical, which is a factor preventing realization of a high output laser. Therefore, there has been demanded realization of a high-output semiconductor laser that can realize a ridge portion whose side surfaces are vertical, and prevent a kink in the optical output—current characteristic from occurring, and a manufacturing method of the semiconductor laser.

BRIEF SUMMARY OF THE INVENTION

According to a first aspect of the present invention, there is provided a semiconductor laser comprising:

a substrate;

a double hetero structure formed above the substrate, the double hetero structure portion including a first clad layer formed above the substrate, an active layer formed on the first clad layer and a second clad layer formed on the active layer, the second clad layer having a stripe-form projection on an upper surface thereof, the projection having an upper portion whose sidewalls are substantially vertically formed on the surface of the substrate and a step-shaped lower portion whose line width is larger than that of the upper portion; and a current blocking layer formed extending from side surfaces of the projection to an upper surface of the second clad except an upper surface of the projection.

Further, according to a second aspect of the present invention, there is provided a semiconductor laser comprising:

a first conductivity-type compound semiconductor substrate;

a double hetero structure portion formed above the compound semiconductor substrate, the double hetero structure portion having the first conductivity-type clad layer, an active layer, a second conductivity-type first clad layer, a second conductivity-type etching stop layer and a second conductivity-type second clad layer which are sequentially formed above the compound semiconductor substrate, the second clad layer having a current concentration portion formed on an upper surface of the double hetero structure as a strip-form projection, the current concentration portion having a first ridge portion whose sidewalls is substantially vertically formed on the substrate and a step-shaped second ridge portion whose line width is larger than that of the first ridge portion; and a current blocking layer formed extending from side surfaces of the first and second ridge portions to the second conductivity-type first clad layer except an upper surface of the first ridge portion.

Furthermore, according to a third aspect of the present invention, there is provided a semiconductor laser manufacturing method comprising:

forming a double hetero structure portion by sequentially forming a first clad layer, an active layer and a second clad layer above a substrate to form a double hetero structure portion;

selectively etching the second clad layer partway by a reactive ion etching method, and forming a stripe-form projection whose sidewalls have a substantially vertical shape with respect to the substrate;

forming a sidewall insulating film on side surfaces of the projection; and using the sidewall insulating film as a mask, and partially removing a remaining upper surface of the second clad layer by a wet etching method.

DETAILED DESCRIPTION OF THE INVENTION

Before explaining embodiments in detail, effects of the following embodiments will be described.

According to the embodiments, ridge sidewalls can be vertically formed by using RIE as etching to form a current concentration portion (ridge portion). At this moment, all of the clad layer portion forming the ridge is not etched by RIE, but a major part of it is etched by RIE and a remaining part is subjected to wet etching. As a result, occurrence of damage due to RIE can be suppressed, while maintaining vertical sides by RIE.

More specifically, the first RIE is not performed until an etching stop layer is reached, but it is stopped before reaching the etching stop layer. As a result, a sidewall shape vertical to the ridge portion can be obtained. After forming a sidewall insulating film, etching is assuredly stopped in the etching stop layer by wet-etching the remaining clad layer, and the etching stop layer is thereafter wet-etched, thereby removing the etching stop layer except the ridge portion.

A width of the ridge formed by the second etching (wet etching) is larger than a width of the ridge formed by the first etching (RIE) and has a tapered shape. However, by sufficiently enlarging the first etching depth and reducing the second etching depth, the ridge width can be substantially regarded as a ridge width on the upper side obtained by the first etching. Since this width is determined by RIE and does not have a taper, it can be strictly controlled according to design.

As described above, according to the embodiments, a laser structure which has a vertical ridge shape and a narrow ridge width can be realized, a kink in an optical output—current characteristic can be restricted, and a high output can be realized.

Embodiments according to the present invention will now be described hereinafter with reference to the accompanying drawings.

(First Embodiment)

Figure 1A:
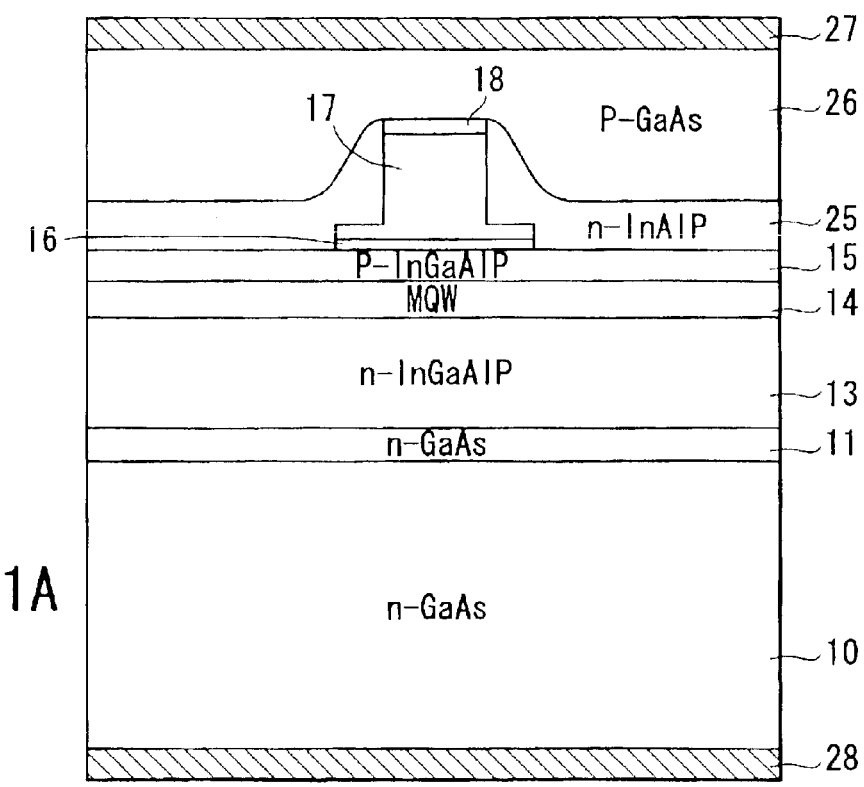
FIG. 1A is a cross-sectional view showing an element structure of a red semiconductor laser according to a first embodiment.
Figure 1B:
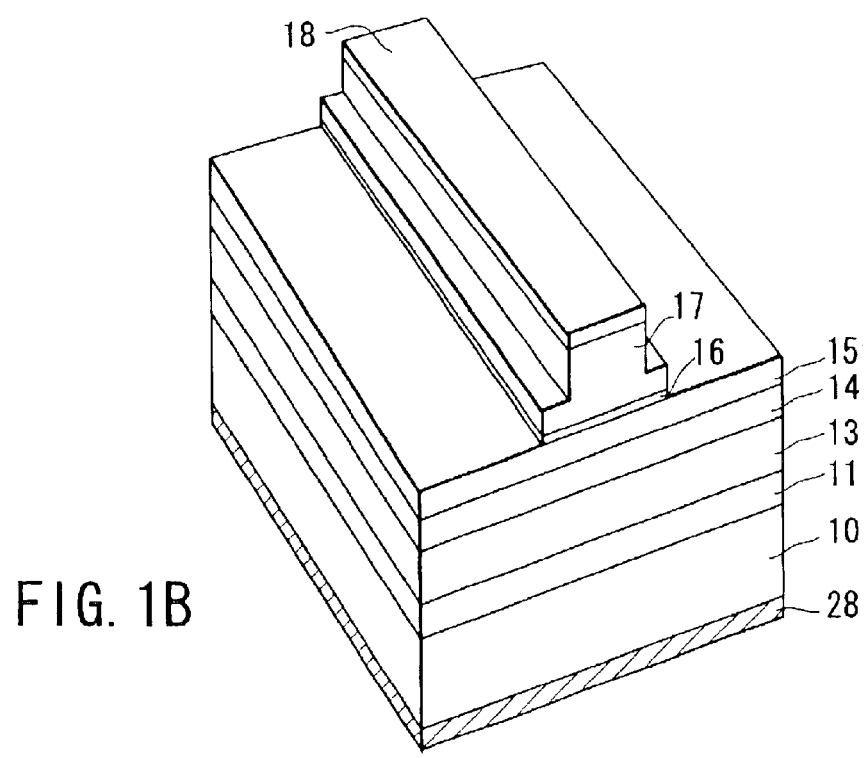
FIG. 1B is a perspective view of a semiconductor laser before layers above an n-InAlP layer 25 in FIG. 1A are formed.

A red semiconductor laser according to a first embodiment of the present invention is configured as in FIGS. 1A and 1B. An n type GaAs buffer layer 11, an n type InGaAlP clad layer 13, an MQW active layer 14 comprised of non-doped InGaAlP/InGaP, a p type InGaAlP clad layer 15 are formed on an n type GaAs substrate 10. As shown in FIG. 1B, on the p type InGaAlP clad layer 15 is formed a stripe-form ridge portion comprised of a p type InGaP etching stop layer 16, a p type InGaAlP clad layer 17, and a p type InGaP cap layer 18.

The ridge portion functions as a current concentration portion, and its side surfaces are substantially vertically processed. Further, the bottom portion of the p clad layer 17 and the etching stop layer 16 have widths wider than any other area. Side surfaces of the ridge portion are embedded by an n type InAlP block layer 25, a p type GaAs contact layer 26 is formed on the cap layer 18 of the ridge portion and the block layer 25 and its surface is flattened. Moreover, a p side electrode 27 is formed on the contact layer 26, and an n side electrode 28 is formed on the back side of the substrate 10.

A manufacturing method of the laser according to this embodiment will now be described with reference to FIGS. 2A to 2D.

Figure 2A:
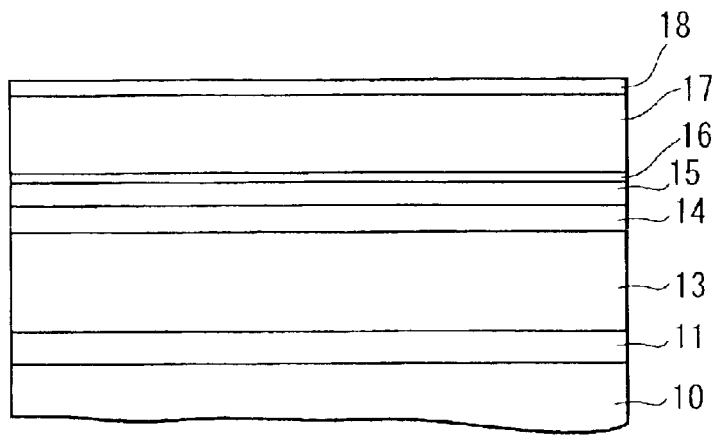
FIGS. 2A to 2D are cross-sectional views sequentially showing manufacturing steps of the semiconductor laser according to the first embodiment.

First, as shown in FIG. 2A, an n type GaAs buffer layer 11 having a thickness of 0.5 $\mu$m is grown on the GaAs substrate 10 having a thickness of 250 $\mu$m. Then, on the buffer layer 11 are grown an n-In$_{0.5}$ (Ga$_{0.3}$Al$_{0.7}$)$_{0.5}$P clad layer 13 having a thickness of 1.2 $\mu$m, an MQW active layer 14 comprised of non-doped In$_{0.5}$ (Ga$_{0.55}$Al$_{0.45}$)$_{0.5}$P/In$_{0.5}$Ga$_{0.5}$P having a thickness of 0.05 $\mu$m, a p-In$_{0.5}$ (Ga$_{0.3}$Al$_{0.7}$)$_{0.5}$P clad layer 15 having a thickness of 0.2 $\mu$m, a p-InGaP etching stop layer 16 having a thickness of 0.01 $\mu$m, and a p-In$_{0.5}$ (Ga$_{0.3}$Al$_{0.7}$)$_{0.5}$P clad layer 17 having a thickness of 0.9 $\mu$m, thereby forming a double hetero structure. Furthermore, a p-InGaP cap layer 18 having a thickness of 0.1 $\mu$m is grown on the p clad layer 17. It is to be noted that the respective layers 11 to 18 are continuously grown in the same chamber by an MOCVD method.

Figure 2B:
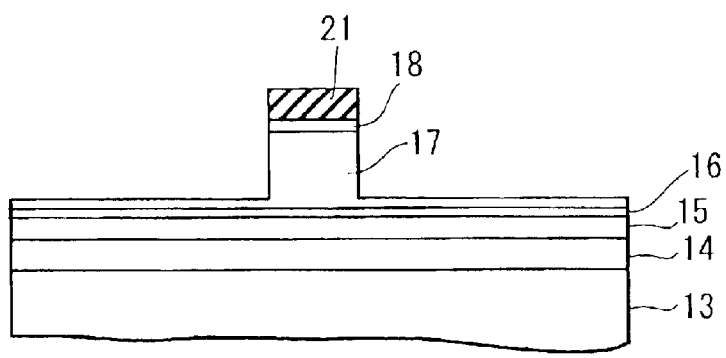

Subsequently, an SiO$_2$ film having a thickness of 0.2 $\mu$m is deposed on the cap layer 18, this SiO$_2$ film is patterned using a resist mask, thereby forming an SiO$_2$ mask 21 having a width of 2.0 $\mu$m is formed as shown in FIG. 2B. Then, this SiO$_2$ mask 21 is used to vertical-process the p-InGaP cap layer 18 and the p-InGaAlP clad layer 17 by 0.1 $\mu$m and 0.8 $\mu$m, respectively, by RIE. As a result, a first ridge having a width of 2.0 $\mu$m is formed. This RIE is performed by using an etching gas containing Cl under the conditions of a pressure 1 Pa and an RF power 250 W. It is to be noted that the ridge is generally formed with a width of 1.0 to 2.5 $\mu$m.

Figure 2C:
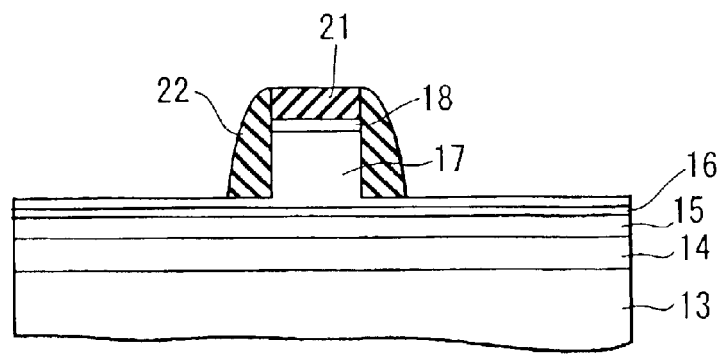

Then, as shown in FIG. 2C, an SiN film (sidewall insulating film) 22 is formed on first ridge sidewalls by self-aligning. Specifically, 0.5 $\mu$m of the SiN film is deposited on the entire surface and then etched back. As a result, the SiN film with the 0.4 $\mu$m thickness is left on the ridge sidewalls.

Figure 2D:
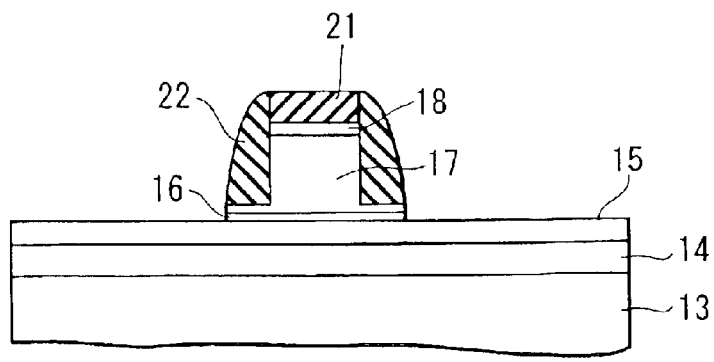

Subsequently, as shown in FIG. 2D, the sidewall insulating film 22 is used as a mask, 0.1 $\mu$m of the p-InGaAlP clad layer 17 around the ridge is etched by using phosphoric acid, and the p-InGaP etching stop layer 16 is then etched by using a liquid containing Br. When the phosphoric acid is used, since a speed of etching InGaAlP is sufficiently fast as compared with InGaP, only the remaining p clad layer 17 after RIE can be assuredly removed. When the liquid containing Br is used, a speed of etching InGaP is sufficiently fast as compared with InGaAlP, the etching stop layer 16 can be assuredly removed without reducing the thickness of the p clad layer 15.

The wet etching is carried out with the sidewall insulating film 22 being formed on the sidewalls of the ridge portion. This wet etching has the surface orientation dependency. If etching is carried out without protecting the sidewall insulating film 22, the sidewalls of the clad layer 17 portion forming the ridge portion may possibly be deformed into the tapered shape.

Moreover, etching of the clad layer 17 by RIE is not performed until the etching stop layer 16 is exposed, but it is stopped immediately before the etching stop layer is exposed, and etching of the remaining clad layer 17 is then effected by wet etching. Therefore, etching of the clad layer 17 can be assuredly stopped in the etching stop layer 16. In addition, since the etching stop layer 16 is also wet-etched, the underlying p clad layer 15 is not damaged.

Thereafter, only the sidewall insulating film 22 is selectively removed by dry etching, then the SiO$_2$ mask 21 is used to epitaxially grow the n-In$_{0.5}$Al$_{0.5}$P block layer 25 to a thickness of 0.2 $\mu$m. Since the n-In$_{0.5}$Al$_{0.5}$P layer is not grown on the SiO$_2$ mask 21, it is selectively deposited on the p-In$_{0.5}$ (Ga$_{0.3}$Al$_{0.7}$)$_{0.5}$P clad layer 15.

In addition, after removing the SiO$_2$ mask 21 on the upper part of the ridge portion, the p-GaAs contact layer 26 is deposited and the surface is flattened. Thereafter, the p electrode (Au containing Zn) 27 is evaporated, and an upper electrode is formed by a resist mask. Additionally, the GaAs substrate 10 is polished to obtain a thickness of 100 μm, and then an n electrode (Au containing Ge) 28 is formed, thereby obtaining the structure shown in FIG. 1.

Thereafter, annealing is performed at 450° C. for 150 minutes in the Ar atmosphere. Further, a wafer is cleaved and realized as a chip in such a manner that the ridge portion has a predetermined length determined by an oscillation frequency.

As described above, according to this embodiment, by forming the major part of the ridge portion by RIE, the sidewalls of the ridge portion can have a vertical shape, and the upper ridge width can be narrowed according to a design value. Therefore, the upper ridge width is not narrowed more than necessary unlike in a case of wet etching. Thus, an increase in an operating voltage can be suppressed, and a high output can be realized. Furthermore, the effect of the step portion can prevent a kink in the optical output—current characteristic from being generated.

Incidentally, although the bottom part of the ridge portion is processed by wet etching, since the etching depth is relatively small, there is no problem even if this part has a tapered shape. In view of realization of a high output laser, it is desirable for the height of the bottom part of the ridge portion to be smaller than the height of the vertical part of the upper portion.

On the contrary, when the bottom part of the ridge portion is etched by RIE, etching damage is generated in the underlying p clad layer 15. In this embodiment, wet-etching the bottom part of the ridge portion can prevent occurrence of the etching damage.

Figures 3, 4:
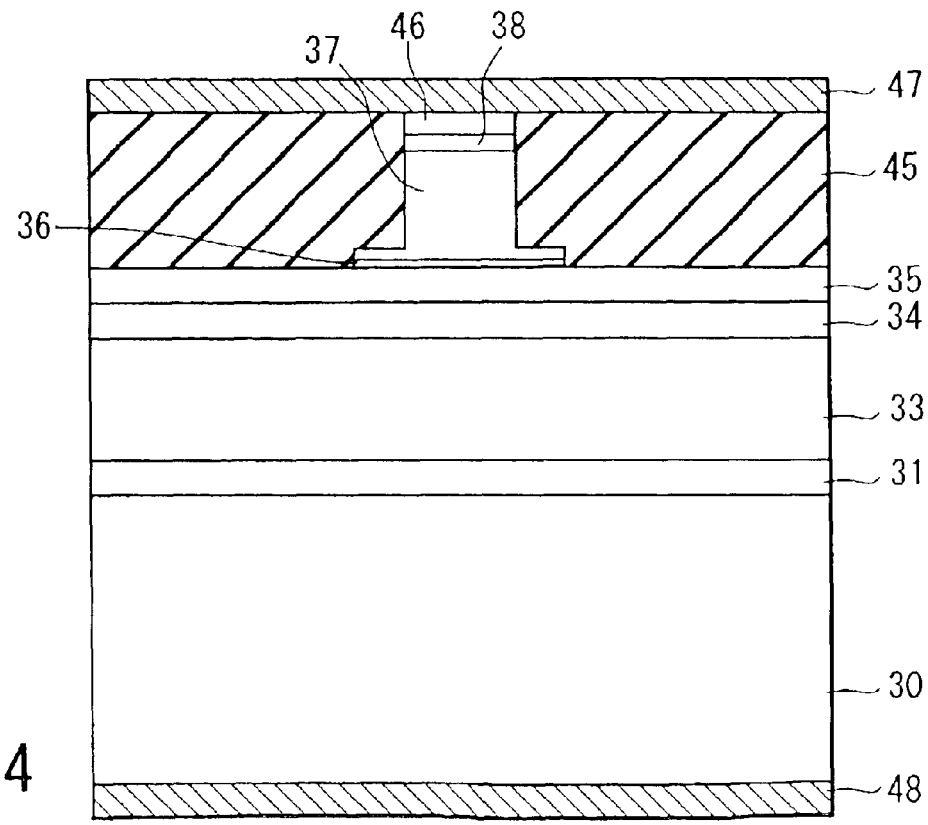
FIG. 3 is a table showing a result of examining a relationship between a height and a width of a ridge portion step and an effect of suppressing a kink in an optical output—current characteristic.
FIG. 4 is a cross-sectional view showing an element structure of a red semiconductor laser according to a second embodiment.

Description will now be given as to a result of examining a step dimension of the ridge portion. In the structure shown in FIG. 2A, a sample was obtained by giving a thickness 0.25 μm to the p clad layer 15 and 1.15 μm to the p clad layer 17, and the ridge portion was formed by RIE-processing the p clad layer 17 with a width of 1.6 μm. At this moment, a sample in which a height and a width of the step remaining in the ridge lower portion are changed was created, and a degree of a kink generated in the optical output—current characteristic was observed. FIG. 3 shows the results.

FIG. 3 shows a relation between the degree of kink prevention and the height and width of the step, which were varied to 0.4, 0.7 and 1.0 μm. "Excellent" means that there was no kink, and "Poor" means that there was a kink. "Good" means that there was no kink but an output was lowered.

From the results shown in FIG. 3, the height must be less than 1.0 μm, and 0.7 μm or lower is desirable. Furthermore, a width must be less than 0.7 μm, and 0.4 μm or lower is desirable.

A ratio of the height of the step relative to the thickness of the P clad layer 17 may be not less than 50% in some cases according to the data (for example, in a case where a step height is 1.0 μm, a step width is 0.7 μm, and the thickness of the p clad layer is 1.15 μm), but it is desirable to reduce it to 50% or lower while confirming the margin.

(Second Embodiment)

In a red semiconductor laser according to a second embodiment of the present invention, the block layer 45 is formed of SiO$_2$ as shown in FIG. 4.

On the n type GaAs substrate 30 are formed an n type GaAs buffer layer 31, an n type InGaAlP clad layer 33, an MQW active layer 34 comprised of non-doped InGaAlp/InGaP, and a p type InGaAlP clad layer 35, and a strip-form ridge portion comprised of a p type InGaP etching stop layer 36, a p type InGaAlP clad layer 37, a p type InGaP cap layer 38 and a p type GaAs contact layer 46 is formed thereon.

Side surfaces of the ridge portion are substantially vertically processed, and the bottom part of the p clad layer 37 and the etching stop layer 36 have widths wider than any other area. The side surfaces of the ridge portion are embedded by the SiO$_2$ film (blocking layer) 45, and the surface is flattened. Furthermore, a p side electrode 47 is formed on the contact layer 46 of the ridge portion and the SiO$_2$ film 45, and the n side electrode 48 is formed on the back side of the substrate 10.

A laser manufacturing method according to this embodiment will now be described with reference to FIGS. 5A and 5B.

First, like the first embodiment mentioned above, on the n-GaAs substrate 30 having a thickness of 250 μm are grown an n type GaAs buffer layer 31 having a thickness of 0.5 μm, an n-In$_{0.5}$ (Ga$_{0.3}$Al$_{0.7}$)$_{0.5}$P clad layer 33 having a thickness of 1.2 μm, an MQW active layer 34 with a 0.05 μm thickness comprised of non-doped In$_{0.5}$(Ga$_{0.55}$Al$_{0.45}$)$_{0.5}$P/In$_{0.5}$Ga$_{0.5}$P, a p-In$_{0.5}$(Ga$_{0.3}$Al$_{0.7}$)$_{0.5}$ P clad layer 35 with a 0.2 μm thickness, a p-InGaP etching stop layer 36 with a 0.01 μm thickness, a p-In$_{0.5}$ (Ga$_{0.3}$Al$_{0.7}$)$_{0.5}$ P clad layer 37 with a 0.9 μm thickness, and a p-InGaP cap layer 38 with 0.1 μm thickness.

The steps described above are completely the same as those in the first embodiment. Then, a p-GaAs contact layer 46 with a thickness of 0.1 μm is further grown on the cap layer 38. It is to be noted that the respective layers 31 to 38 and 46 are continuously grown in the same chamber by the MOCVD method.

Figure 5A:
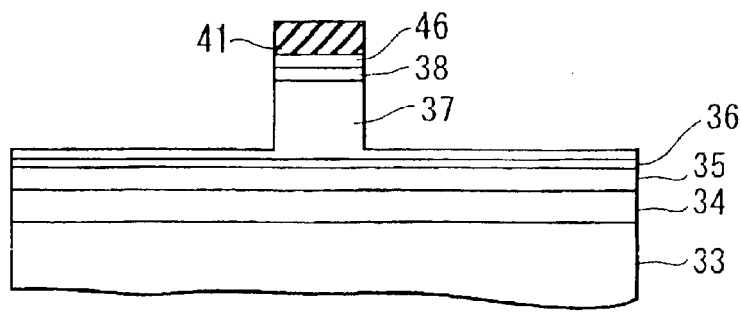
FIGS. 5A and 5B are cross-sectional views sequentially showing manufacturing steps of a laser depicted in FIG. 4.

Then, an SiO$_2$ film with a thickness of 0.2 μm is deposited on the contact layer 46, this SiO$_2$ film is patterned by a resist mask, and an SiO$_2$ mask 41 with a width of 2.0 μm is formed as shown in FIG. 5A. Subsequently, this SiO$_2$ mask 41 is used to vertical-process the p-GaAs contact layer 46, the p-InGaP cap layer 38 and the p-InGaAlP clad layer 37 by 0.1 μm, 0.1 μm and 0.8 μm, respectively. By doing so, a first ridge with a width of 2.0 μm is formed.

Figure 5B:
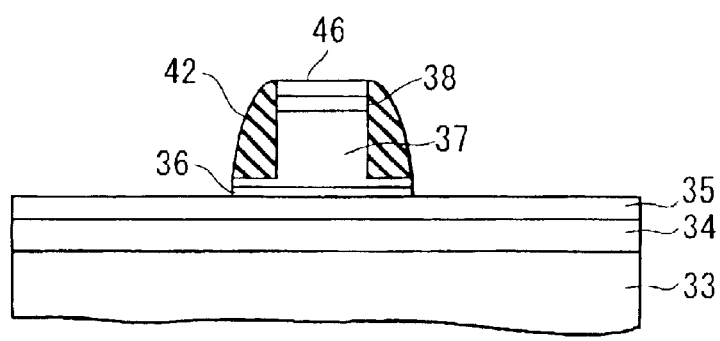

Subsequently, as shown in FIG. 5B, the SiO$_2$ film (sidewall insulating film) 42 is formed on the first ridge sidewalls by self-aligning. Specifically, 0.5 μm of the SiO$_2$ film is deposited on the entire surface and then etched back, thereby leaving the SiO$_2$ film with the thickness of 0.4 μm on the ridge sidewalls.

Then, the sidewall insulating film 42 is used as a mask, the p clad layer 37 around the ridge is etched 0.1 μm by using a phosphoric acid, and the p-InGaP etching stop layer 36 is etched by using a liquid containing Br. In this case, like the first embodiment, only the p clad layer 17 which is left intact by RIE can be assuredly removed by etching using the phosphoric acid, and etching using the liquid containing Br can securely remove the etching stop layer 16 without reducing the thickness of the p clad layer 15. Moreover, since wet etching is performed with the sidewall insulating film 42 being provided, the vertical sidewall portions of the ridge can be prevented from being tapered.

Thereafter, the sidewall insulating film 42 is removed, then the SiO$_2$ blocking layer 45 is spin-coated to have a thickness of 1.1 μm, and then deposited. In addition, the entire surface of the SiO$_2$ blocking layer 45 is etched back by 0.1 μm, and only the ridge upper portion is exposed. Then, the p electrode (Au containing Zn) 47 is evaporated on the contact layer 46, and an upper electrode is formed by the resist mask. Additionally, the GaAs substrate 30 is polished to obtain a thickness of 100 μm, and then an n electrode (Au containing Ge) 48 is formed, thereby obtaining the structure shown in FIG. 4.

Thereafter, annealing is carried out at 450° C. for 15 minutes in an Ar atmosphere as a heat treatment. Further, the wafer is cleaved and realized as a chip in such a manner that a length of a ridge portion becomes a predetermined length determined by an oscillation frequency.

In this embodiment, the upper ridge width can be likewise narrowed according to a design value by forming the majority of the ridge part by RIE, and the upper ridge width is not narrowed more than needs unlike the case where it is formed by wet etching. Therefore, it is possible to obtain the advantages equal to those in the first embodiment. Furthermore, since the current blocking layer 45 is formed of the insulating film superior in the leak characteristic, realization of a higher output is enabled.

(Modification)

It is to be noted that the present invention is not restricted to the above-described embodiments. Although the vertical side surfaces of the ridge portion are desirable, the present invention is not restricted to the completely vertical side surfaces, and there occurs no problem even if the side surfaces are slightly inclined as long as they are substantially close to the vertical state. Moreover, a material forming the double hetero structure portion is not restricted to the InGaAlP-based material at all, and it can be appropriately changed in accordance with a specification. In addition, a material of the etching stop layer is not restricted to InGaP, and it is possible to employ any material which can take an etching selectivity which is sufficient with respect to the clad layer.

Figure 6:
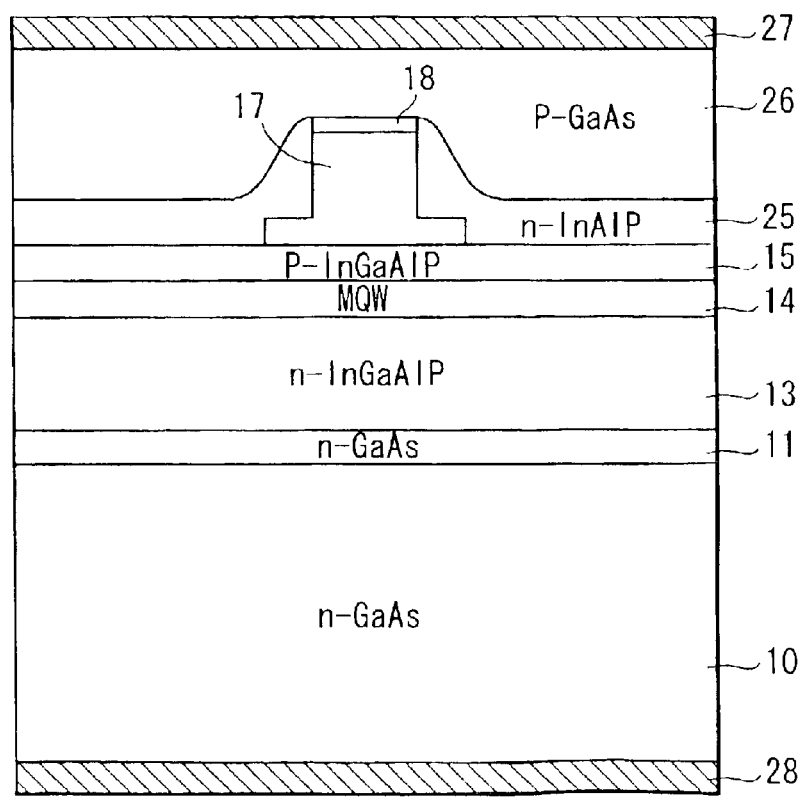
FIG. 6 is a cross-sectional view showing a modification of the first embodiment.

Additionally, although the etching stop layer is provided in order to strictly control the height of the ridge portion, the etching stop layer can be eliminated when etching of the clad layer by RIE enables the strict depth control (see FIG. 6).

Figure 7:
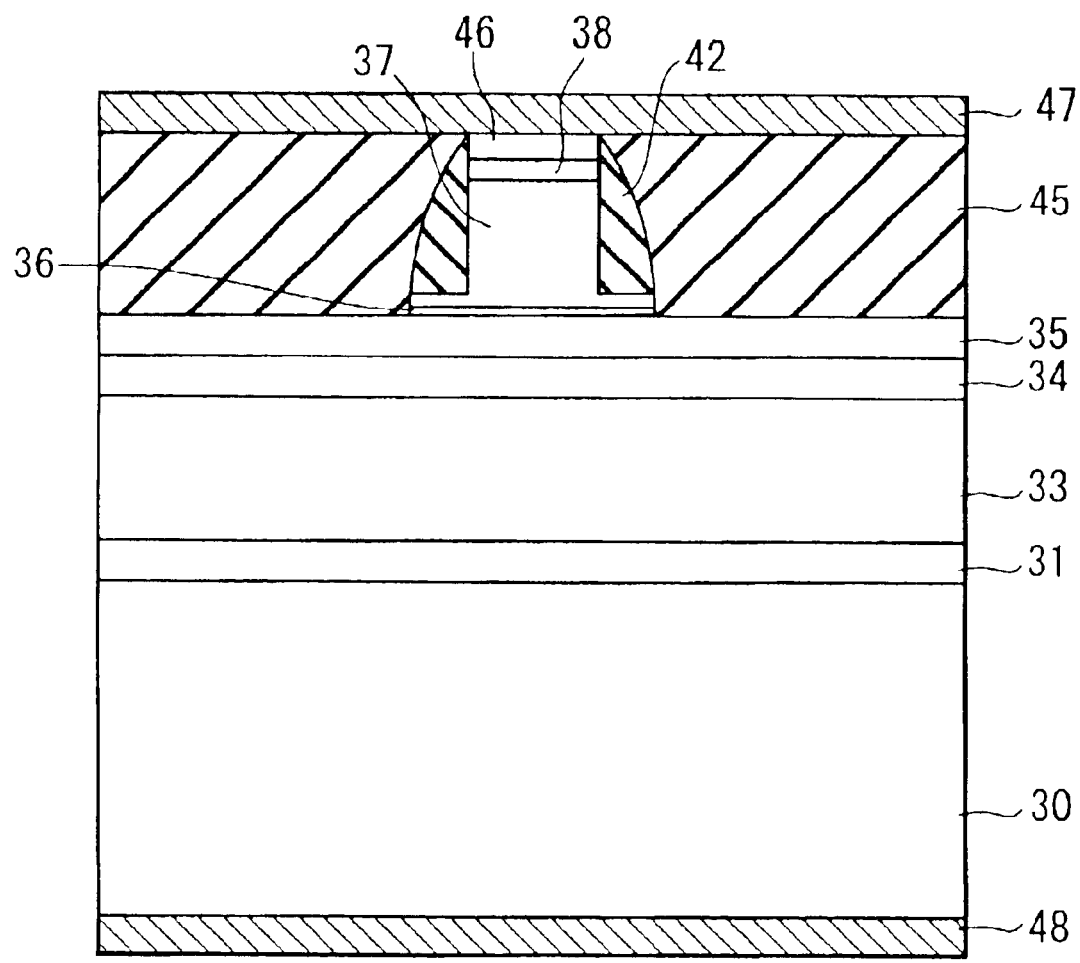
FIG. 7 is a cross-sectional view showing a modification of the second embodiment.

As to the sidewall insulating film, the example of eliminating it after the formation step of the ridge portion has been illustrated, but the current blocking layer may be formed with the sidewall insulating film being left intact (see FIG. 7).

Further, the substrate side is determined as the n type and the opposite side is determined as the p type with respect to the active layer in this embodiment, they can be counterchanged.

As described above in detail, according to the embodiments of the present invention, the ridge portion whose side surfaces have the vertical shape can be realized, the step can be provided to the ridge bottom portion, a kink in the optical output—current characteristic in the semiconductor laser can be suppressed, and a higher output can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser comprising:
   a substrate;
   a double hetero structure portion formed above the substrate, the double hetero structure portion including a first clad layer formed above the substrate, an active layer formed on the first clad layer, and a second clad layer formed on the active layer, the second clad layer having a stripe-form projection on an upper surface thereof, the projection having an upper portion whose sidewalls are substantially vertically formed on the surface of the substrate and a step-shaped lower portion whose line width is larger than that of the upper portion; and
   an insulating current blocking layer formed extending from the side surfaces of the projection to the upper surface of the second clad layer except an upper surface of the projection.

2. The semiconductor laser according to claim 1, wherein a height of the upper portion of the projection is larger than a height of the lower portion.

3. The semiconductor laser according to claim 1, wherein the second clad layer includes an etching stop layer in the middle of a thickness direction, and the projection is provided on the second clad layer above the etching stop layer.

4. The semiconductor laser according to claim 1, wherein a height of the lower portion of the projection is less than 1.0 μm.

5. The semiconductor laser according to claim 1, wherein a laterally protruding length of the step form of the lower portion of the projection is less than 0.7 μm.

6. A semiconductor laser comprising:
   a first conductivity-type compound semiconductor substrate;
   a double hetero structure portion formed above the compound semiconductor substrate, the double hetero structure portion having the first conductivity-type clad layer, an active layer, a second conductivity-type first clad layer, a second conductivity-type etching stop layer, and a second conductivity-type second clad layer sequentially formed above the compound semiconductor substrate, the second clad layer having a current concentration portion formed on an upper surface of the double hetero structure as a stripe-form projection, the current concentration portion having a first ridge portion whose sidewalls are substantially vertically formed on the substrate and a step-shaped second ridge portion whose line width is larger than that of the first ridge portion; and
   a current blocking layer formed extending from side surfaces of the first and the second ridge portions to an upper surface of the second conductivity-type first clad layer except an upper surface of the first ridge portion.

7. The semiconductor laser according to claim 6, wherein a height of the first ridge portion is larger than a height of the second ridge portion.

8. The semiconductor laser according to claim 6, wherein a height of the second ridge portion is less than 1.0 μm.

9. The semiconductor laser according to claim 6, wherein a laterally protruding length of the step form of the second ridge portion is less than 0.7 μm.

10. The semiconductor laser according to claim 6, wherein the current blocking layer is a first conductivity-type semiconductor layer.

11. The semiconductor laser according to claim 6, wherein the current blocking layer is an insulating layer.

12. A manufacturing method of a semiconductor laser, comprising:
   sequentially forming a first clad layer, an active layer and a second clad layer above a substrate to form a double hetero structure portion;

selectively etching the second clad layer partway by a reactive ion etching method, and forming a stripe-form projection whose sidewalls have a substantially vertical shape with respect to the substrate;

forming a sidewall insulating film on side surfaces of the projection; and using the sidewall insulating film as a mask and partially removing a remaining upper surface of the second clad layer by a wet etching method.

13. The manufacturing method of a semiconductor laser according to claim 12, wherein said forming of the sidewall insulating film includes leaving an insulating film on the side surfaces of the projection by depositing the insulating film and then etching back the insulating film.

14. The manufacturing method of a semiconductor laser according to claim 12, wherein the substrate is a first conductivity-type compound semiconductor substrate, the first clad layer is of the first conductivity-type, and the second clad layer is of a second conductivity-type.

15. The manufacturing method of a semiconductor laser according to claim 14, wherein said forming of the second clad layer includes sequentially forming a first sub-clad layer which is of the second conductivity-type, an etching stop layer which is of the second conductivity-type and a second sub-clad layer which is of the second conductivity-type, said selectively etching of the second clad layer partway by a reactive ion etching method includes selectively etching the second conductivity-type second sub-clad layer to the middle of a layer thickness thereof by a reactive ion etching method, and said partially removing of a remaining upper surface of the second clad layer by a wet etching method includes removing a remaining part of the second sub-clad layer by a wet etching method.

16. The manufacturing method of a semiconductor laser according to claim 12, further comprising forming a current blocking layer on side surfaces of the projection, after said partially removing of a remaining upper surface of the second clad layer by a wet etching method.

17. The manufacturing method of a semiconductor laser according to claim 16, wherein said forming of the current blocking layer on side surfaces of the projection includes forming the current blocking layer with the sidewall insulating film being left intact.

18. The manufacturing method of a semiconductor laser according to claim 16, wherein said forming of the current blocking layer on the side surfaces of the projection includes forming the current blocking layer after removing the sidewall insulating film.

* * * * *